(12) United States Patent
Abe

(10) Patent No.: US 9,761,470 B2
(45) Date of Patent: Sep. 12, 2017

(54) WAFER CARRIER

(71) Applicant: TOYOTA JIDOSHA KABUSHIKI KAISHA, Toyota (JP)

(72) Inventor: Nobuhira Abe, Miyoshi (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/699,235

(22) Filed: Apr. 29, 2015

(65) Prior Publication Data

US 2015/0325462 A1 Nov. 12, 2015

(30) Foreign Application Priority Data

May 8, 2014 (JP) ................................. 2014-096757

(51) Int. Cl.
   *H01L 21/673* (2006.01)
   *H01L 21/67* (2006.01)
(52) U.S. Cl.
   CPC .... *H01L 21/6719* (2013.01); *H01L 21/67353* (2013.01); *H01L 21/67373* (2013.01); *H01L 21/67376* (2013.01)
(58) Field of Classification Search
   CPC ......... H01L 21/67353; H01L 21/67376; H01L 21/67373; H01L 21/673
   See application file for complete search history.

(56) References Cited

U.S. PATENT DOCUMENTS

| 3,615,006 A * | 10/1971 | Freed .................. G03F 7/70741 |
| | | 206/454 |
| 5,314,068 A * | 5/1994 | Nakazato ............... B65D 55/12 |
| | | 206/454 |
| 5,988,392 A * | 11/1999 | Hosoi ............... H01L 21/67373 |
| | | 206/711 |
| 6,988,620 B2 * | 1/2006 | Haggard ........... H01L 21/67369 |
| | | 206/710 |
| 2013/0162117 A1 | 6/2013 | Hara et al. |

FOREIGN PATENT DOCUMENTS

| JP | H05-175321 A | 7/1993 |
| JP | H07-248614 A | 9/1995 |
| JP | H08-288371 A | 11/1996 |
| JP | 2010-040887 | 2/2010 |
| JP | 2011-108698 | 6/2011 |
| JP | 2011-258722 | 12/2011 |
| WO | WO 2013/187121 A1 | 12/2013 |

* cited by examiner

*Primary Examiner* — Andrew Perreault
(74) *Attorney, Agent, or Firm* — Oblon, McClelland, Maier & Neustadt, L.L.P.

(57) ABSTRACT

A wafer carrier 1 includes a lower unit 2 on which a semiconductor wafer 100 is placed, and an upper unit 3 detachably attached to the lower unit 2, and forming a sealed chamber 4 for housing the semiconductor wafer 100 between the upper unit 3 and the lower unit 2. The upper unit 3 is provided with plural lock mechanisms 5 that fix the lower unit 2 to the upper unit 3 by abutting on a side surface of the lower unit 2.

6 Claims, 4 Drawing Sheets

WAFER CARRIER

INCORPORATION BY REFERENCE

This application is based upon and claims the benefit of priority from Japanese patent application No. 2014-096757, filed on May 8, 2014, the disclosure of which is incorporated herein in its entirely by reference.

BACKGROUND OF THE INVENTION

1. Field of the Invention

The present invention relates to a wafer carrier including a lower unit on which a semiconductor wafer is placed and an upper unit forming a sealed chamber for housing the semiconductor wafer between the upper unit and the lower unit.

2. Description of Related Art

A manufacturing process of a SMIF (Standard Mechanical Interface) system in which air pollution control is not uniformly directed to the entire manufacturing process of a semiconductor device but is focused on only a space where a semiconductor wafer exists is proposed. In the manufacturing process of the SMIF system, a sealed chamber called a wafer carrier is used at the time of carrying the semiconductor wafer to each processing equipment or storing the semiconductor wafer.

For example, a wafer carrier including a lower unit on which a semiconductor wafer is placed and an upper unit detachably attached to the lower unit and forming a sealed chamber for housing the semiconductor wafer between the upper unit and the lower unit is known (refer to Japanese Unexamined Patent Application Publication No. 2011-108698). The lower unit is fixed to the upper unit by engaging a lock lever provided in the upper unit with a lower surface of the lower unit.

However, for example, in a process of carrying the wafer carrier to each processing equipment, the lower surface of the lower unit is exposed to the air. Accordingly, dust elements are liable to be adhered to the lock lever engaged with the lower surface of the lower unit. Furthermore, a clean chamber is formed on the lower surface side of the lower unit at the time of opening and closing the wafer carrier. Accordingly, dust elements adhered to the lock lever or dust elements generated by the lock lever may enter the clean chamber.

SUMMARY OF THE INVENTION

The present invention has been made in view of the above problems, and an object thereof is to provide a wafer carrier capable of suppressing entering of dust elements to the clean chamber.

An aspect of the present invention to achieve the object stated above is a wafer carrier comprising: a lower unit on which a semiconductor wafer is placed; and an upper unit detachably attached to the lower unit, and forming a sealed chamber for housing the semiconductor wafer between the upper unit and the lower unit, wherein the upper unit is provided with plural lock mechanisms that fix the lower unit to the upper unit by abutting on a side surface of the lower unit.

Accordingly, it is possible to suppress the entering of dust elements to the clean chamber by fixing a side surface of the lower unit not contacting the clean chamber by lock mechanisms.

In this aspect, concave portions may be formed in the side surface of the lower unit, and the respective lock mechanisms may be fitted to the concave portions. Accordingly, the lock mechanisms is fitted to the concave portions of the lower unit, thereby the lower unit can be stably fixed to the upper unit.

In this aspect, each lock mechanism may include a spherical body fitted to the concave portion of the lower unit, a lock lever provided in the upper unit so as to swing, a tip portion of which abuts on the spherical body to press the spherical body to the concave portion side of the lower unit and a spring member that biases the tip portion of the lock lever to the spherical body side.

In this aspect, a through hole piercing in the swinging direction of the lock lever of the lock mechanism may be formed in the upper unit, and the spherical body is provided so as to reciprocate in the through hole, and a convex portion protruding to the central side of the through hole and inclined to the lock lever is formed at an end portion of the sealed chamber side inside the through hole.

Accordingly, it is positively prevent a spherical body from falling off from a through hole to the sealed chamber side when the lower unit is detached from the upper unit. Furthermore, when the abutting of the lock lever with respect to the spherical body is released, the spherical body moves to the lock lever side in accordance with the inclination of a convex portion. Therefore, the abutting between the concave portion of the lower unit and the spherical body is released and the lower unit can be detached from the upper unit easily.

In this aspect, the upper unit may be provided with a guide member that guides extension/contraction of the spring member in the direction of the spherical body.

Accordingly, a guide member can be extended/contracted stably in the direction of the spherical body, which can suppress dust generation due to the spring member.

In this aspect, the lock mechanisms may be built in the upper unit.

Accordingly, it is possible to prevent the adhesion of dust elements to the lock mechanisms.

In this aspect, the spherical body may be made of a metal, and the lock lever may be made of a resin.

Accordingly, as the spherical body is made of a metal, it is possible to suppress dust generated when the spherical body abuts on the lock lever and the concave portion of the lower unit and so on. Furthermore, when the lock lever is made of a resin, the wafer carrier can be reduced in weight.

In this aspect, plural lug portions having different shapes from each other and protruding outward may be formed in the side surface of the lower unit, the concave portions may be formed in side surfaces of the lug portions, and concave positioning portions may be respectively formed in the upper unit so as to correspond to the lug portions of the lower unit Accordingly, the relative positional relationship between the upper unit and the loser unit is uniquely decided, which can prevents an attachment error between the lower and the upper units.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
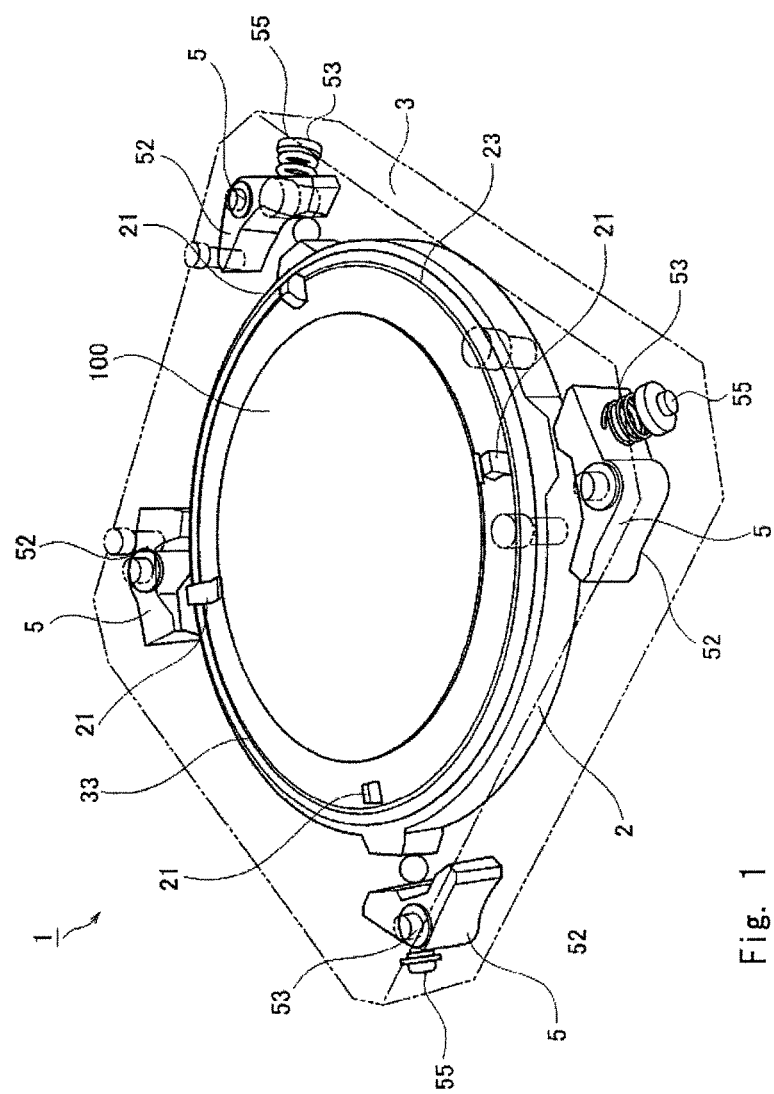
FIG. 1 is an oblique view showing a schematic structure of a wafer carrier according to an embodiment.
Figure 2:
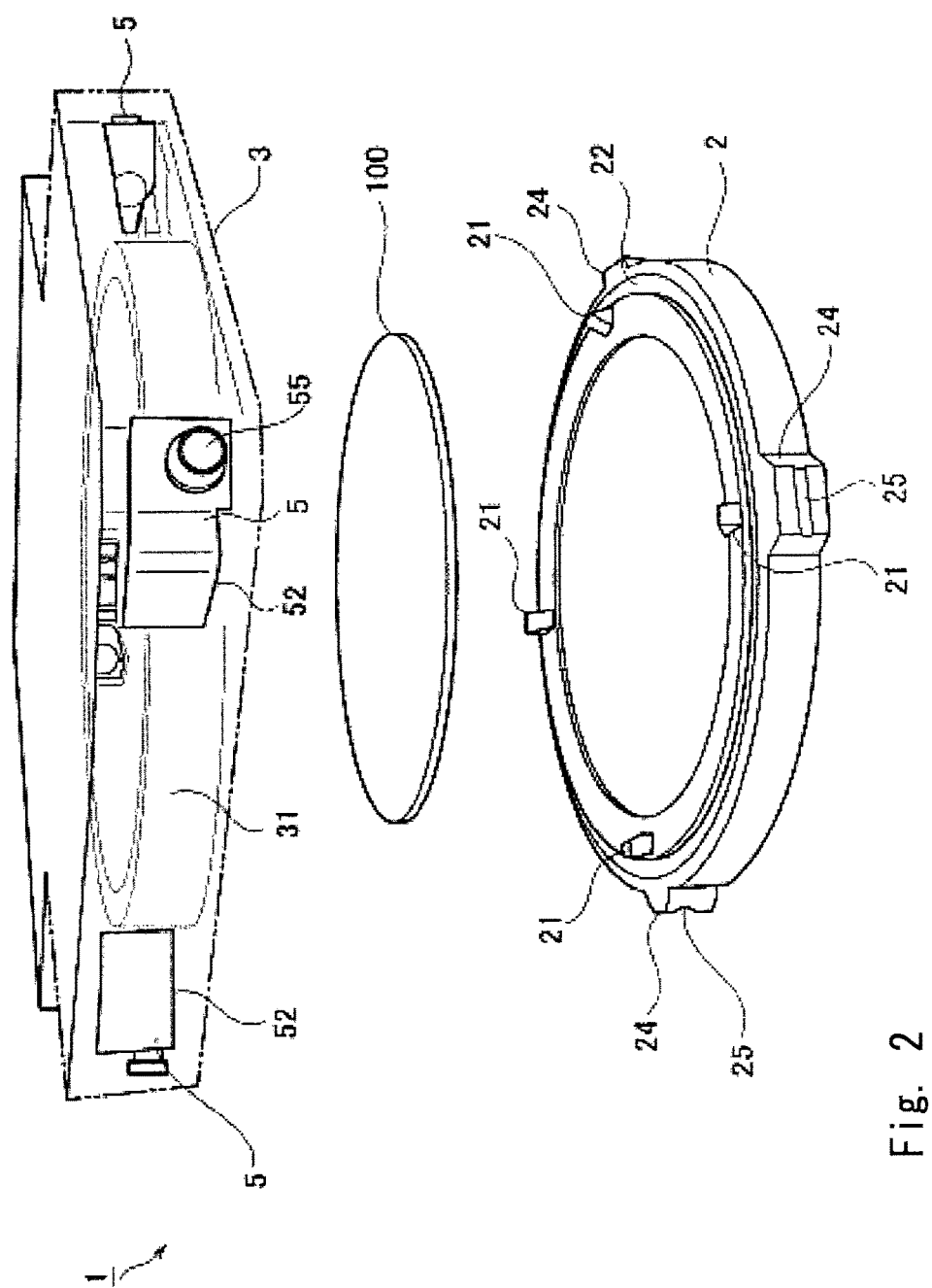
FIG. 2 is an exploded oblique view of the wafer carrier according to the embodiment.

Hereinafter, an embodiment of the present invention will be explained with reference to the drawings. FIG. 1 is an oblique view showing a schematic structure of a wafer carrier according to an embodiment of the present invention, which is a perspective view seen through an upper unit. FIG. 2 is an exploded oblique view of the wafer carrier according to the embodiment of the present invention.

A wafer carrier 1 according to the embodiment is used in a manufacturing process of a SMIF (Standard Mechanical Interface) system in which air pollution control is focused on a space where a semiconductor wafer 100 exists. The wafer carrier 1 according to the embodiment includes a lower unit 2 on which the semiconductor wafer 100 is placed and an upper unit 3 detachably attached to the lower unit 2.

Figure 3:
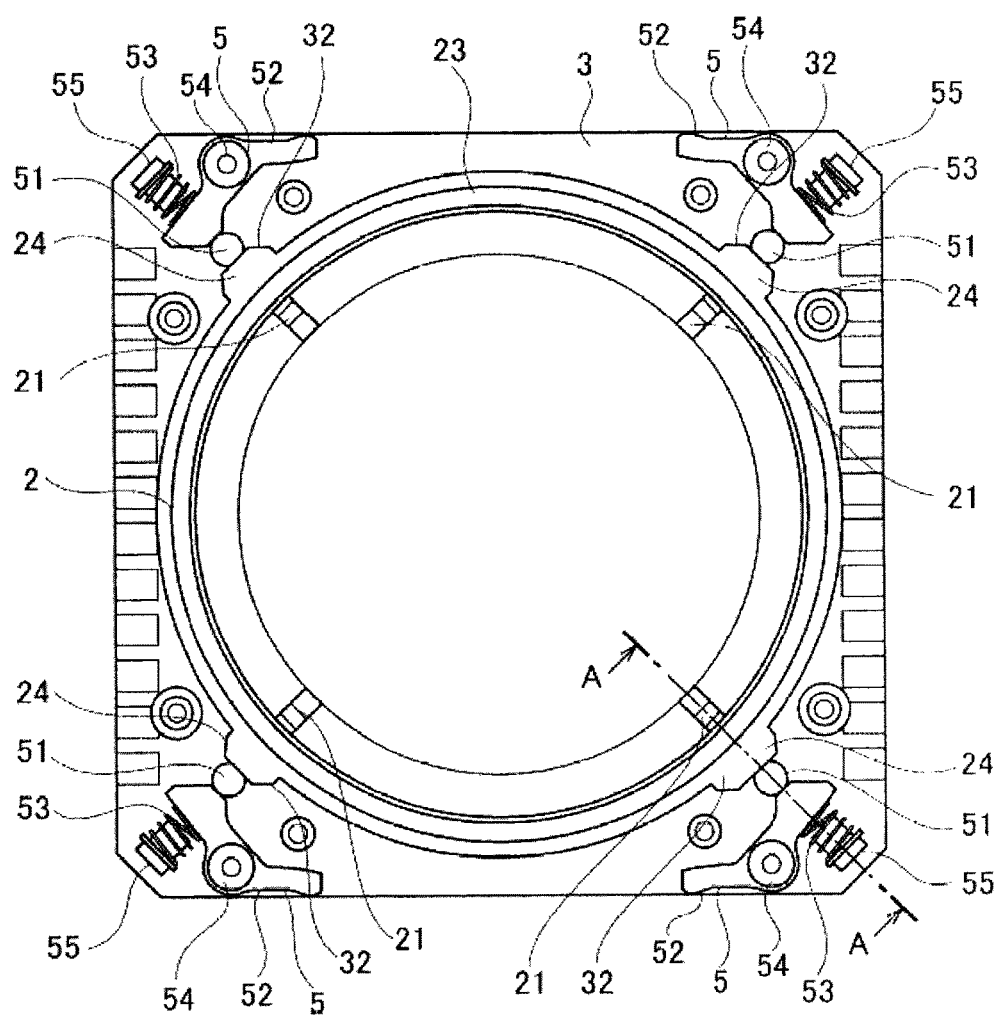
FIG. 3 is a top view of the wafer carrier according to the embodiment seen from the above.
Figure 4:
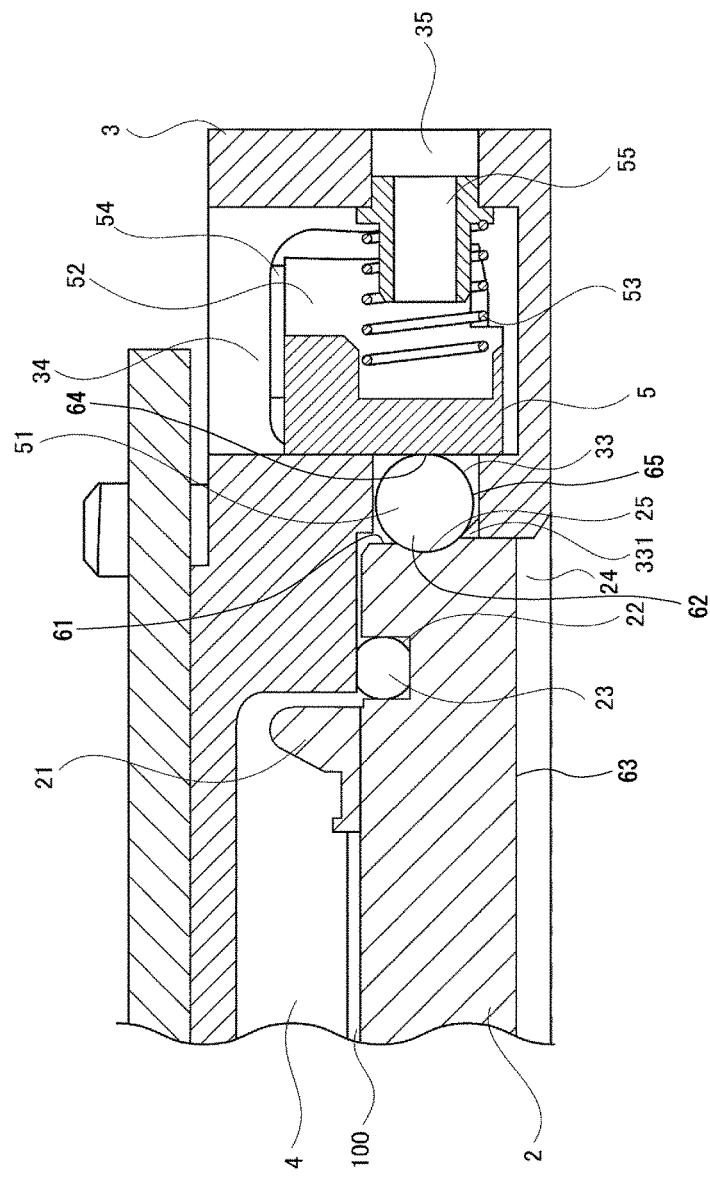
FIG. 4 is a cross-sectional view of the wafer carrier shown in FIG. 3 taken along A-A line.

FIG. 3 is a top view of the wafer carrier according to the embodiment seen from the above, which is a perspective view seen through an upper unit. FIG. 4 is a cross-sectional view of the wafer carrier shown in FIG. 3 taken along A-A line.

The upper unit 3 is formed in a box shape, and there is formed a substantially disc-shaped space portion 31 whose lower is opened inside the upper unit 3. The space portion 31 of the upper unit 3 is covered with the lower unit 2 from the lower side, thereby forming a sealed chamber 4 between the upper unit 3 and the lower unit 2. The semiconductor wafer 100 is housed in the sealed chamber 4. The upper unit 3 is provided with plural lock mechanisms 5 fixing the lower unit 2 to the upper unit 3 by abutting on a side surface 61 of the lower unit 2.

When the lower unit 2 is fitted to the upper unit 3, a lower surface of the lower unit 2 is positioned above an upper side of a lower surface of the upper unit 3. That is, the lower surface of the lower unit 2 is in a state of being floated when the wafer carrier 1 is placed. Accordingly, for example, when the wafer carrier 1 is placed on a conveyer and carried, it is possible to suppress adhesion of dust elements to the lower surface 63 of the lower unit 2.

The lower unit 2 is formed, for example, to have a substantially disc shape. On an upper surface of the lower unit 2, for example, four fixing members 21 for fixing the semiconductor wafer 100 are provided at equal intervals, however, the present invention is not limited to this. The number and positions of fixing members 21 provided in the lower unit 2 may be arbitrary. The respective fixing members 21 are engaged with an outer edge of the semiconductor wafer 100, thereby fixing the semiconductor unit 100 to the lower unit 2. On the upper surface of the lower unit 2, a groove portion 22 is formed along an outer periphery thereof. A substantially ring-shaped seal 23 made of an elastic material such as rubber or resin is fitted to the groove portion 22. When the lower unit 2 is fitted to the upper unit 3, the seal 23 of the lower unit 2 closely contacts the upper unit 3. Accordingly, the sealed chamber 4 formed between the upper unit 3 and the lower unit 2 can be sealed.

On a side surface 61 of the lower unit 2, plural lug portions 24 having different shapes from each other and protruding outward are formed. For example, two pairs of lug portions 24 are formed at positions facing each other on the side surface 61 of the lower unit 2, however, the present invention is not limited to this. The number and positions of the lug portions 24 to be formed can be arbitrarily set. Concave positioning portions 32 are respectively formed in the upper unit 3 at positions corresponding to the lug portions 24 of the lower unit 2. The respective positioning portions 32 of the upper unit 3 are fitted to the corresponding lug portions 24 of the lower unit 2, thereby positioning and fixing the lower unit 2 with respect to the upper unit 3.

Here, a width of one lug portion 24 in the four lug portions 24 of the lower unit 2 is larger than widths of other three lug portions 24. Therefore, the respective positioning portions 32 of the upper unit 3 are not displaced when fitted to the lug portions 24 of the lower unit 2. Accordingly, the relative positional relationship is uniquely decided, an attachment error between the lower and upper units 2 and 3 can be prevented.

The method of positioning the lower and upper units 2 and 3 is an example, and the present invention is not limited to this. For example, the respective positioning portions 32 of the upper unit 3 and the lug portions 24 of the lower unit 2 can be arbitrarily set, and it is also preferable to perform positioning by writing lines, figures and so on in the upper unit 3 and the lower unit 2 without providing the positioning portions 32 and the lug portions 24.

In side surfaces 61 of the respective lug portions 24 of the lower unit 2, concave portions 25 on which the lock mechanisms 5 abut are respectively formed. The four lock mechanisms 5 in total are provided, for example, in the vicinities of corner portions of the upper unit 3 respectively, however, the present invention is not limited to this. It may also be to apply a structure in which two or three lock mechanisms 5 are provided in the upper unit 3. The number and positions of the lock mechanisms 5 provided in the upper unit 3 can be arbitrarily set as long as the lower unit 2 can be stably fixed to the upper unit 3.

Each lock mechanism 5 includes a spherical body 51 fitted to the concave portion 25 of the lug portion 24 of the lower unit 2, a lock lever 52 provided in the upper unit 3 so as to swing and a spring member 53 biasing the lock lever 52.

A through hole 33 piercing from the space portion 31 in the swinging direction of the lock lever 52 of the lock mechanism 5 is formed in the upper unit 3. The spherical body 51 is provided so as to reciprocate in the through hole 33. The spherical body 51 abuts on the concave portion 25 of the lug portion 24 in the lower unit 2. The spherical body 51 is made of, for example, a metal. Accordingly, it is possible to suppress the dust generated when the spherical body 51 reciprocates in the through hole 33 or abuts on the lock lever 25 and the concave portion 25 of the lug portion 24 in the lower unit 2.

Note that the lower unit 2 may be fixed to the upper unit 3 by allowing a tip portion 64 of the lock lever 52 to directly abut on the concave portion 25 of the lug portion 24 in the lower unit 2 without providing the spherical body 51 inside the through hole 33. The structure of the lock mechanism 5 can be thus simplified. The lower unit 2 may be fixed to the upper unit 3 by forming the lug portion 24 of the lower unit 2 to have a flat side surface without forming the concave portion 25 in the lug portion 24 and allowing the tip portion 64 of the lock lever 52 to abut on the flat side surface to use a friction force to be generated.

A convex portion 331 protruding toward the central side is formed at an end portion of the sealed chamber side inside the through hole 33. Accordingly, it is positively prevent the spherical body 51 from falling off accidentally from the through hole 33 to the space portion 31 side when the lower unit 2 is detached from the unit 3. Moreover, the convex portion 331 is inclined toward the lock lever 52 side. Accordingly, when the abutting of the lock lever 52 is released, the spherical body 51 naturally moves toward the lock lever 52 side in accordance with the inclination of the convex portion 331. Therefore, the abutting between the convex portion 25 of the lug portion 24 in the lower unit 2 and the spherical body 51 is released and the lower unit 2 can be detached from the upper unit 3 easily.

The lock lever 52 is formed to be bent in a substantially doglegged shape. Cavity portions 34 having a substantially doglegged shape are respectively formed at respective corner portions of the upper unit 3. The cavity portions 34 are communicated with the through hole 33 of the special body 51, opening upward and sideward respectively. A hinge shaft 54 is provided to stand in each cavity portion 34. The lock lever 52 is pivotally supported by the hinge shaft 54 at almost the center of the lock lever 52.

The lock lever 52 swings in the horizontal direction around the hinge shaft 54 inside the cavity portion 34. The tip portion 64 of the lock lever 52 abuts on the spherical body 51 and presses the spherical body 51 onto the concave portion 25 of the lug portion 24 in the lower unit 2. When the lock lever 52 abuts on the spherical body 51 while swinging, a slight positional shift in a lateral direction occurs between the lock lever 52 and the spherical body 51. However, the positional shift in the lateral direction can be absorbed by a curve surface of the spherical body 51. Accordingly, it is possible to suppress the dust generated when the lock lever 52 abuts on the spherical body 51.

In the tip portion 64 of the lock lever 52, a curved surface is formed so as to correspond to the spherical shape of the spherical body 51. Accordingly, it is possible to prevent the dust from being generated when the tip portion 64 of the lock lever 52 abuts on the spherical body 51. A user presses a rear end of the lock lever 52 from an opening on the side of the cavity portion 34 to swing the lock lever 52.

The spring member 53 biases the tip portion 64 of the lock lever 52 to the spherical body side. A tip portion of the spring member 53 is fitted to a concave portion formed in an outside surface (opposite-side surface of the spherical body 51) of the tip portion 64 of the lock lever 52, The biasing force of the spring member 53 allows the tip portion 64 of the lock lever 52 to abut on the spherical body 51 to press the spherical body 51 onto the concave portion 25 of the lug portion 24 in the lower unit 2. The special body 51 is fitted to the concave portion 25 of the lug portion 24 in the lower unit 2 to thereby fit the lower unit 2 to the upper unit 3.

On the other hand, when the rear end portion of the lock lever 52 is pressed inward (in a clockwise direction), the lock lever 52 swings in a direction opposite to the spherical body 51 (in the direction of the spring member 53) around the hinge shaft 54. The tip portion 64 of the lock lever 52 is separated from the spherical body 51. The fitting between the spherical body 51 and the concave portion 25 of the lug portion 24 in the lower unit 2 is released and the fixing of the lower unit 2 with respect to the upper unit 3 is released. Accordingly, the lower unit 2 can be detached from the upper unit 3 easily. The lock lever 52 is made of a resin for reducing the weight of the wafer carrier 1.

The spring member 53 is, for example a metal member formed in a spiral shape, which is arranged toward the central direction of the upper unit 3. Another through hole 35 extending from the cavity portion 34 to the outside is formed in the upper unit 3. Another through hole 35 extends on the same axis as the through hole 33 of the spherical body 51. One end of a guide member 55 guiding the spring member 53 is fitted and fixed to the through hole 35. The user can perform attachment, detachment, adjustment and so on of the spring member 53 easily through an upper opening of the cavity 34.

One end of the guide member 55 is fitted to the through hole 35 and fixed toward the direction of the spherical body 51. The spring member 53 is inserted into an outer periphery of the guide member 55. Accordingly, the spring member 53 can be extended/contracted stably in the direction of the spherical body, which can suppress the dust generation due to the spring member 53. As described above, respective lock mechanisms 5 are built in the upper unit 3. Accordingly, it is possible to prevent adhesion of dust elements to respective lock mechanisms 5 in a carrying process of the wafer carrier 1 and so on. It is also possible to prevent dust elements from entering a clean chamber through respective lock mechanisms 5.

Incidentally, for example, in the process of carrying the wafer carrier to each processing equipment, the lower surface 29 of the lower unit is exposed to the air, or the wafer carrier is carried in a state where the lower surface of the lower unit is put on a conveyer. Therefore, dust elements are liable to be adhered to the lower end side of the lower unit. Additionally, the clean chamber is formed in the lower surface side of the lower unit at the time of opening and closing the wafer carrier in each processing equipment.

On the other hand, in the wafer carrier 1 according to the embodiment, plural lock mechanisms 5 are provided in the upper unit 3 as described above. The spherical body 51 of respective lock mechanisms 5 fix the lower unit 2 to the upper unit 3 by abutting on the side surface 61 of the lower unit 2 and a lowermost part 65 of spherical body 51 is positioned above the lower surface 63 of the lower unit 2. The side surface 61 of the lower unit 2 which is hardly exposed to the air and which does not contact the clean chamber is fixed by the lock mechanisms 5, thereby suppressing entering of dust elements into the clean chamber.

Next, a method of carrying the wafer carrier according to the embodiment will be explained in detail.

The wafer carrier 1 is carried to the processing equipment for performing various manufacturing processes by a conveyer and so on. In the processing equipment, for example, a load port device for opening closing the lower and upper units 2 and 3 of the carried wafer carrier 1 is provided. In the load port device, a clean chamber which is cleaned at a high level as compared with ambient atmosphere is formed. The clean chamber is communicated with the clean chamber in which processing is actually performed to the semiconductor wafer 100.

The carried wafer carrier 1 is fixed to the load port device. At this time, the upper unit 3 is fixed to a stationary stage and the lower unit 2 is fixed on a movable stage which vertically moves. Plural spaces are provided on an upper surface of the movable stage contacting the lower surface 63 of the lower unit 2. While the dust elements adhered to the lower surface 63 of the lower unit 2 are sucked from the space portion, the lower unit 2 is fixed on the movable stage by the sucking force.

When the rear end of the lock lever 52 of each lock mechanism 5 is pressed so as to be pushed into the upper unit 3, the lock mechanism 52 swings in the clockwise direction around the hinge shaft 54. The tip portion 64 of the lock lever 52 is separated from the spherical body 51. Accordingly, the spherical body 51 inside the through hole 33 retracts toward the lock lever 52 and the fixing of the lower unit 2 with respect to the upper unit 3 is released.

At this time, the contact between the lower unit 2 and the spherical body 51, and all the operations of the spherical body 51, the lock lever 52 and the spring member 53 are performed in the side part of the lower unit 2. Though the wafer carrier 1 according to the embodiment has the structure in which generation of dust elements is suppressed, the dust elements are generated only in the side part of the lower unit 2 and are not generated at a lower part of the lower unit 2 even when the dust elements are generated. Furthermore, the lock mechanisms 5 are built in the upper unit 3. Accordingly, the dust elements are not adhered to the lock mechanisms 5 during conveyance.

As the movable stage moves downward, the lower unit 2 on the movable stage is detached from the upper unit 3 and moved into the clean chamber inside the load port device. As described above, the dust elements are not generated in the lower part of the lower unit 2. Accordingly, the dust elements do not enter the clean chamber of the load port device existing in the lower surface side of the lower unit 2.

From the invention thus described, it will be obvious that the embodiments of the invention may be varied in many ways. Such variations are not to be regarded as a departure from the spirit and the scope of the invention, and all such modifications as would be obvious to one skilled in the art are intended for inclusion within the scope of the following claims.

What is claimed is:

1. A wafer carrier comprising:
    a lower unit of which a semiconductor wafer is placed, wherein the lower unit comprises a lower surface that meets a side surface that is substantially perpendicular to the lower surface; and
    an upper unit detachably attached to the lower unit, and forming a sealed chamber for housing the semiconductor wafer between the upper unit and the lower unit, wherein
    concave portions are formed in the side surface of the lower unit,
    the upper unit is provided with plural lock mechanisms that fix the lower unit to the upper unit, the plural lock mechanisms abut on the side surface of the lower unit in the concave portions,
    each lock mechanism includes a spherical body fitted to the concave portion of the lower unit, a lock lever provided in the upper unit so as to swing, wherein the lock lever includes a tip portion of which abuts on the spherical body to press the spherical body to the concave portion side of the lower unit and a spring member that biases the tip portion of the lock lever to the spherical body side, and
    the spherical body of respective lock mechanisms abut on the side surface of the lower unit, and a lowermost part of the spherical body is positioned above a plane formed by the lower surface of the lower unit in a direction of the upper unit.

2. The wafer carrier according to claim 1, wherein a through hole formed in a swinging direction of the lock lever of the lock mechanism is formed in the upper unit, and the spherical body is provided so as to reciprocate in the through hole, and
    a convex portion protruding to a central side of the through hole and inclined to the lock lever is formed at an end portion of the sealed chamber side inside the through hole.

3. The wafer carrier according to claim 1, wherein the upper unit is provided with a guide member that guides extension and contraction of the spring member in the direction of the spherical body.

4. The wafer carrier according to claim 1, wherein the lock mechanisms are built in the upper unit.

5. The wafer carrier according to claim 1, wherein the spherical body is made of a metal, and
    the lock lever is made of a resin.

6. The wafer carrier according to claim 1, wherein plural lug portions having different shapes from each other and protruding outward are formed in the side surface of the lower unit,
    the concave portions are formed in side surfaces of the lug portions, and
    concave positioning portions are respectively formed in the upper unit so as to correspond to the lug portions of the lower unit.

* * * * *